United States Patent
Shirota

(10) Patent No.: US 7,879,784 B2
(45) Date of Patent: Feb. 1, 2011

(54) STRIPPING AGENT COMPOSITION FOR A RESIST

(75) Inventor: Mami Shirota, Wakayama (JP)

(73) Assignee: KAO Corporation, Tokyo (JP)

( * ) Notice: Subject to any disclaimer, the term of this patent is extended or adjusted under 35 U.S.C. 154(b) by 0 days.

(21) Appl. No.: 10/910,338

(22) Filed: Aug. 4, 2004

(65) Prior Publication Data

US 2005/0032659 A1 Feb. 10, 2005

(30) Foreign Application Priority Data

Aug. 5, 2003 (JP) .............................. 2003-286871

(51) Int. Cl.
*C11D 3/22* (2006.01)
*C11D 3/24* (2006.01)
*C11D 3/30* (2006.01)
*C11D 3/43* (2006.01)
*C11D 3/44* (2006.01)

(52) U.S. Cl. ................. 510/176; 510/245; 510/254; 510/499; 510/500; 510/492; 510/493; 510/501; 510/505; 510/506; 134/1.3

(58) Field of Classification Search ........... 510/176, 510/245, 254, 499, 500, 492, 493, 501, 505, 510/506; 134/1.3
See application file for complete search history.

(56) References Cited

U.S. PATENT DOCUMENTS

| | | | |
|---|---|---|---|
| 6,440,326 B1 * | 8/2002 | Maruyama et al. ......... | 252/79.1 |
| 6,458,517 B2 | 10/2002 | Nohara et al. | |
| 6,638,694 B2 * | 10/2003 | Ikemoto et al. ............. | 430/331 |
| 2002/0009674 A1 | 1/2002 | Nohara et al. | |

FOREIGN PATENT DOCUMENTS

| | | |
|---|---|---|
| JP | 9-319098 A | 12/1997 |
| JP | 11-84686 A | 3/1999 |
| JP | 2000-250230 A | 9/2000 |
| JP | 2000-284506 A | 10/2000 |
| JP | 2001-356495 A | 12/2001 |
| JP | 2005-43874 A | 2/2005 |

OTHER PUBLICATIONS

English language abstract of JP 8202051 A (Aug. 9, 1996).
English language abstract of JP 2003262963 A (Sep. 19, 2003).

* cited by examiner

*Primary Examiner*—Gregory R Del Cotto
(74) *Attorney, Agent, or Firm*—Birch, Stewart, Kolasch & Birch, LLP

(57) ABSTRACT

A stripping agent composition for a resist, containing (A) 0.1 to 10% by weight of an amine; (B) 80 to 99% by weight of an organic solvent having a Hansen's solubility parameter of from 18 to 33 MPa$^{1/2}$; (C) 0.01 to 3% by weight of a sugar; and (D) 0 to 5% by weight of water; a method for stripping a resist, including the step of stripping the resist with the stripping agent composition; and a method for manufacturing a semiconductor device, including the step of stripping a resist with the stripping agent composition. By using the stripping composition of the present invention, for example, a high-quality IC or LSI semiconductor device circuit, especially a compound semiconductor device circuit can be more economically advantageously manufactured.

10 Claims, 1 Drawing Sheet

US 7,879,784 B2

STRIPPING AGENT COMPOSITION FOR A RESIST

FIELD OF THE INVENTION

This Non-provisional application claims priority under 35 U.S.C. §119(a) on Patent Application No(s). 2003-286871 filed in Japan on Aug. 5, 2003, the entire contents of which are hereby incorporated by reference.

The present invention relates to a stripping agent composition for a resist, a stripping method for a resist with the stripping agent composition and a method for manufacturing a semiconductor device or the like with the stripping agent composition.

BACKGROUND OF THE INVENTION

A semiconductor device is manufactured by applying a photoresist to a semiconductor device made of Si, GaAs, GaN, InP or the like, exposing and developing the photoresist to form a pattern; etching of a semiconductor device of a non-masked region with the photoresist pattern as a mask to form a fine circuit; and stripping the above photoresist from the semiconductor device, or alternatively carrying out ashing to strip off residual resist residue from the semiconductor device after the formation of a fine circuit in the same manner.

Japanese Patent Publication No. Sho 64-42653A discloses a stripping liquid for a positive photoresist, containing dimethyl sulfoxide as a main component, and also containing a nitrogen-containing organic hydroxyl compound and an organic solvent such as glycol ether; and Japanese Patent Publication No. Sho 62-49355A discloses a stripping agent composition containing an alkanolamine, a sulfone compound and a glycol monoalkyl ether. Although both of these can suppress corrosion of Si substrate and Al wire in the Si semiconductor device, the effect of corrosion resistance for a compound semiconductor device made of GaAs or the like is unsatisfactory.

Further, in a stripping agent composition containing an amine, a sulfone compound, and an aromatic hydroxy compound disclosed in Japanese Patent Publication No. Hei 5-281753A (U.S. Pat. No. 5,480,585), since the aromatic hydroxy compound rather accelerates the corrosion of the compound semiconductor device made of GaAs or the like, the stripping agent composition cannot be used in the manufacturing step for a compound semiconductor device. In addition, Japanese Patent Publication No. Hei 8-202051A discloses a photoresist stripping agent composition containing an amine, an acid amide, a sugar or a sugar alcohol, and water. However, since this photoresist stripping agent composition substantially contains 25% by weight or more of water of the entire composition, the corrosion against a compound semiconductor device made of GaAs or the like is large, even though the corrosion of the Si substrate and Al wire in the Si semiconductor can be suppressed. Therefore, it is made impractical to use the photoresist stripping agent composition as a stripping agent for resists or resist residue in the compound semiconductor device.

SUMMARY OF THE INVENTION

The present invention relates to:
[1] a stripping agent composition for a resist, containing by weight of the composition:
(A) from 0.1 to 10% by weight of an amine;
(B) from 80 to 99% by weight of an organic solvent having a Hansen's solubility parameter of from 18 to 33 MPa$^{1/2}$;
(C) from 0.01 to 3% by weight of a sugar; and
(D) from 0 to 5% by weight of water;
[2] a method for stripping a resist, including the step of stripping the resist with the stripping agent composition of the above [1]; and
[3] a method for manufacturing a semiconductor device, including the step of stripping a resist with the stripping agent composition of the above [1].

Figure 1:
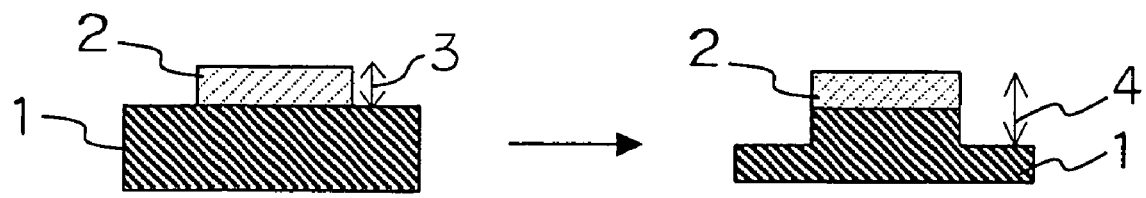
FIG. 1 is a schematic explanatory view of each portion of a substrate determined in the evaluation of corrosion resistance in the Examples.

1 is GaAs, 2 is an insulation film (Si$_3$N$_4$), 3 is a step height A, 4 is a step height B, 5 is a semi-insulating GaAs substrate, 6 is a high-resistant buffer layer, 7 is an active layer, 8 is a source, 9 is a drain, and 10 is a recess.

DETAILED DESCRIPTION OF THE INVENTION

The present invention relates to a stripping agent composition for a resist, capable of easily stripping a resist applied to a semiconductor device made of Si, GaAs, GaN, InP or the like, a metal line and an interlayer insulating thin film, a resist remaining after dry etching, or a resist residue remaining after dry etching followed by ashing at a low temperature and in a short period of time, so that a semiconductor device maintains a field effect transistor (hereinafter referred to as FET) property without corroding the semiconductor device; a method for stripping a resist with the stripping agent composition; and a method for manufacturing a semiconductor device with the stripping agent composition.

These and other advantages of the present invention will be apparent from the following description.

Since the stripping agent composition of the present invention is used, there are some benefits such as being capable of easily stripping a resist applied to a semiconductor device made of Si, GaAs, GaN, InP or the like, a metal line and an interlayer insulating thin film, a resist remaining after dry etching, or a resist residue remaining after dry etching followed by ashing at a low temperature and in a short period of time, so that a semiconductor device maintains its FET property without corroding the semiconductor device. In addition, there is a benefit such as a semiconductor device circuit, especially a compound semiconductor device circuit, can be more economically advantageously manufactured by using the stripping agent composition or the method for stripping a resist of the present invention.

The stripping agent composition for a resist of the present invention (hereinafter simply referred to as "stripping agent composition") is related to a stripping agent composition usable in the manufacture of a semiconductor device for IC or LSI, especially a compound semiconductor made of GaAs, GaN, InP or the like. In the present invention, an excellent stripping agent composition satisfying the stripping property of a resist and prevention of corrosion of a semiconductor device, especially a compound semiconductor device by combining an amine, an organic solvent having a Hansen's solubility parameter (SP) of from 18 to 33 MPa$^{1/2}$, a sugar and 5% by weight or less of water each in a specified content has been found.

The amine (A) used in the present invention has a function of dramatically improving the stripping property of the resist and the resist residue.

The preferred amine includes aliphatic amines, aromatic amines and cyclic amines, and those having 1 to 4 nitrogen atoms in one molecule. Examples of the amine include an aliphatic amine having one nitrogen atom, such as a monoalkylamine having 1 to 20 carbon atoms in one molecule, a dialkylamine having 2 to 22 carbon atoms in one molecule, and a trialkylamine having 3 to 24 carbon atoms in one molecule; an aromatic amine having one nitrogen atom, such as benzylamine, dibenzylamine, tribenzylamine, 1-aminonaphthalene, and an alkylbenzylamine; an aliphatic amine having two nitrogen atoms, such as ethylenediamine, triethylenediamine, 1,3-diaminopropane, 1,6-diaminohexane, 1,3-diaminoxylene, 1,3-bisaminocyclohexane, and tetramethylhexamethylenediamine; an aliphatic amine having three nitrogen atoms, such as diethylenetriamine, an aliphatic amine having four nitrogen atoms, such as triethylenetetramine; a compound prepared by adding an alkylene oxide having 2 to 4 carbon atoms to the above amine compound having 1 to 4 nitrogen atoms in one molecule; an alkanolamine such as monoethanolamine, monopropanolamine, monoisopropanolamine, diethanolamine, methylmonoethanolamine, butylmonoethanolamine, triethanolamine, dimethylmonoethanolamine, methyldiethanolamine, 2-amino-1-propanol, and 1-amino-2-propanol; an alkoxyalkylamine such as 2-methoxyethylamine, 2-ethoxyethylamine, 3-methoxypropylamine, and 3-ethoxypropylamine; an alkoxyalkanolamine such as 2-(2-aminoethoxy)ethanol, and 2-(2-aminoethoxy)propanol. Among them, the alkanolamines are more preferable from the viewpoint of obtaining excellent stripping property of a resist. Among them, monoethanolamine and methylmonoethanolamine are even more preferable. In addition, methylmonoethanolamine is even more preferable in consideration of toxicity and skin irritability.

The content of these amines is from 0.1 to 10% by weight of the stripping agent composition. The content is preferably from 0.2 to 5% by weight, more preferably from 0.5 to 3% by weight, even more preferably from 0.5 to 2% by weight, of the stripping agent composition, from the viewpoint of satisfying both stripping property of a resist and corrosion resistance of a compound semiconductor device. These amines can be used alone or in admixture of two or more kinds.

The organic solvent (B) usable in the present invention has a function of improving the stripping property of the resist and resist residue, and has a Hansen's SP of from 18 to 33 MPa$^{1/2}$. The Hansen's SP is described in the Polymer Handbook Fourth Edition, "Solubility Parameter Values" VII (published by Wiley Interscience), pages 675 to 714. The organic solvent has a SP of preferably from 20 to 31.5 MPa$^{1/2}$, more preferably from 22 to 30 MPa$^{1/2}$, from the viewpoint of solubility of the resist.

Incidentally, the SP value of the organic solvent when two or more kinds of organic solvents are used in admixture is obtained by a load average from the composition amount. The range of the above-mentioned SP value is also applied to a mixed system of organic solvents.

The organic solvent includes ethers, alcohols, carbonyls, phenols, nitrogen-containing compounds and sulfur-containing compounds.

The ether is an organic compound in which two hydrocarbon groups are bonded to an oxygen atom. The ether includes a simple ether in which two hydrocarbon groups are identical to each other; a mixed ether in which two hydrocarbon groups are different from each other; an acetal which has two ether bonds on the same carbon; and cyclic ethers which has an ether bond in the ring. Among them, trioxan and methylal are even more preferable. In addition, the glycol ether represented by the following formula (I):

$$R^1[(X)(AO)_sR^2]_t \qquad (I)$$

wherein $R^1$ is a hydrogen atom or a hydrocarbon group having 1 to 8 carbon atoms, preferably a hydrogen atom or a hydrocarbon group having 1 to 6 carbon atoms; $R^2$ is a hydrogen atom or a hydrocarbon group having 1 to 8 carbon atoms, preferably a hydrogen atom or a hydrocarbon group having 1 to 4 carbon atoms, more preferably a hydrogen atom or a hydrocarbon group having 1 or 2 carbon atoms; X is an —O— group, a —C(O)O— group, an —NH— group, or an —N((AO)$_u$H)— group, wherein AO is an alkylene oxide having 2 to 3 carbon atoms and u is an integer of from 1 to 3; s is an integer of from 1 to 20; t is an integer of from 1 to 8, preferably from 1 to 3, more preferably from 1 or 2, is also effective as the ether for dissolving the resist.

The glycol ether represented by formula (I) includes an alkyl ether of ethylene glycol, diethylene glycol, triethylene glycol, tetraethylene glycol, pentaethylene glycol, or hexaethylene glycol, or an alkyl ether of propylene glycol, dipropylene glycol, or tripropylene glycol. Among them, an alkyl ether of ethylene glycol or diethylene glycol is preferable from the viewpoint of solubility of the resist.

The alcohol is a hydroxy compound in which a hydrogen atom of an aliphatic or alicyclic hydrocarbon is replaced with a hydroxyl group. The alcohol includes a monoalkyl alcohol such as methanol, ethanol, butanol, and pentanol; and a polyhydric alcohol such as ethylene glycol, diethylene glycol, triethylene glycol, polyethylene glycol, propylene glycol, dipropylene glycol, tripropylene glycol, polypropylene glycol, 1,3-propanediol, 2-methyl-1,3-propanediol, butanediol, pentanediol, hexanediol and glycerol. Ethylene glycol and diethylene glycol are even more preferable from the viewpoint of solubility of the negative resist.

The carbonyl is a compound having a structure in which a carbonyl group is bonded to a hydrocarbon group or a hydrogen atom, representatively which includes a ketone and an aldehyde. Among them, acrolein and methyl ethyl ketone are even more preferable from the viewpoint of solubility of the resist.

The phenol is an aromatic hydroxy compound in which hydrogen atom of the aromatic hydrocarbon core is replaced with a hydroxyl group. Among them, phenol, benzyl phenol, and m-cresol are preferable from the viewpoint of solubility of the resist.

The preferred nitrogen-containing compound is not particularly limited as long as the compound having a molecular weight of 200 or less contains one or more nitrogen atoms. Preferable nitrogen-containing compounds include amides such as formamide, N-methylformamide, N-ethylformamide, N,N-dimethylformamide, N,N-diethylformamide, acetamide, N-methylacetamide, N-ethylacetamide, N,N-dimethylacetamide, and N,N-diethylacetamide; pyrrolidones such as N-methyl-2-pyrrolidone, N-ethyl-2-pyrrolidone, N-propyl-2-pyrrolidone, and N-butyl-2-pyrrolidone; dimethyl imidazolidinone, from the viewpoint of solubility of the resist.

The preferred sulfur-containing compound is not particularly limited as long as the compound having a molecular weight of 200 or less contains one or more sulfur atoms. The sulfur-containing compounds are even more preferably dimethyl sulfoxide and sulforane, from the viewpoint of solubility of the resist.

The content of these organic solvents is from 80 to 99% by weight of the stripping agent composition. The content is preferably from 88 to 99% by weight, more preferably from 92 to 99% by weight, even more preferably from 95 to 99% by weight, of the stripping agent composition, from the viewpoint of solubility and stripping property of the resist.

The organic solvents can be used alone or in admixture of two or more kinds. It is even more preferable to use dimethyl sulfoxide, which is a sulfur-containing compound, in combination with an alcohol selected from methanol and ethanol, or with a nitrogen-containing compound selected from dimethylformamide, dimethylacetamide, N-methyl-2-pyrrolidone and dimethyl imidazolidinone, from the viewpoint of the stripping property of the resist.

Here, dimethyl sulfoxide is preferable as a dissolution agent for a positive or negative resist. Since the freezing point of dimethyl sulfoxide alone is as low as 18° C., a stripping agent composition containing this dimethyl sulfoxide as a main component freezes in the winter, thereby making the operability poor. Therefore, it is preferable that dimethyl sulfoxide is used in combination with one or more organic solvents from the viewpoint of operability in the winter. Among them, the content of dimethyl sulfoxide is preferably 72% by weight or less, more preferably 70% by weight or less, even more preferably 67% by weight or less, of the stripping agent composition.

If a polyhydric alcohol is further contained in an amount of 5 to 20% by weight of the stripping agent composition as an organic solvent, the stripping property of the negative resist is improved, and its effects as an antifreeze are exhibited when used in combination with dimethyl sulfoxide.

One of the significant features in the present invention resides in the use of a sugar (C). By using component (C), there is an advantage such as corrosion of the metal line and semiconductor devices can be prevented.

The sugar (C) usable in the present invention includes monosaccharides such as D-xylose, D-glucose, L-idose, and D-fructose; disaccharides such as sucrose; trisaccharides such as raffinose; tetrasaccharides such as stachyose; linear sugar alcohols such as erythritol, xylytol, dulcitol, ribitol, D-sorbitol, D-mannitol, D-iditol; and sugar alcohols of cyclic sugar alcohols such as cyclitol, myo-inositol, and quercitol.

Among them, it is preferable that a sugar has a molecular weight of from 70 to 350, more preferably a sugar having a molecular weight of from 120 to 250, even more preferably a sugar having a molecular weight of from 140 to 210, even more preferably a sugar having a molecular weight of from 150 to 185. Concretely, D-xylose, D-glucose, xylitol, D-sorbitol and D-mannitol are even more preferable. The content of these sugars is from 0.01 to 3% by weight, of the stripping agent composition. The content is preferably from 0.1 to 2.8% by weight, more preferably from 0.5 to 2.5% by weight, even more preferably from 0.5 to 1.5% by weight, of the stripping agent composition, from the viewpoint of prevention of corrosion of metal line.

Water (D), if used in the present invention is preferably one in which ionic substances are controlled, such as ion-exchanged water or ultrapure water. The content of water is from 0 to 5% by weight of the stripping agent composition. One of the significant features in the present invention resides in that the water content is controlled within the range mentioned above. When the content of water is higher than the upper limit of the above range, corrosion of a semiconductor device, especially the compound semiconductor device made of GaAs or the like, is undesirably accelerated in the step of stripping the resist, thereby making it impractical to be used as a stripping agent composition. Therefore, the content of water is preferably 3% by weight or less, more preferably 1% by weight or less, even more preferably 0.5% by weight or less, even more preferably substantially containing no water, of the stripping agent composition.

The content of each of the components of the stripping agent composition of the present invention is (A) from 0.1 to 10% by weight, (B) from 80 to 99% by weight, (C) from 0.01 to 3% by weight, and (D) from 0 to 5% by weight. In order to satisfy the stripping property of a resist and the effect of preventing corrosion of a semiconductor device at high levels, it is preferable that the content of each of the components is (A) from 0.2 to 5% by weight, (B) from 88 to 99% by weight, (C) from 0.1 to 2.8% by weight, and (D) from 0 to 3% by weight, more preferably (A) from 0.5 to 3% by weight, (B) from 92 to 99% by weight, (C) from 0.5 to 2.5% by weight, and (D) from 0 to 1% by weight, even more preferably (A) from 0.5 to 2% by weight, (B) from 95 to 99% by weight, (C) from 0.5 to 1.5% by weight, and (D) from 0 to 0.5% by weight. The content of each component is one during the step of stripping a resist. Therefore, the stripping agent composition previously prepared in a high concentration may be diluted to give the above-mentioned composition upon use.

The stripping agent composition of the present invention may further contain a surfactant. The surfactant includes nonionic surfactants, anionic surfactants, cationic surfactants, amphoteric surfactants and the like. These surfactants may be used alone or in admixture of two or more kinds. The surfactant serves to lower the surface tension of the stripping agent composition, thereby improving the wetting property against the resist or the resist residue. In addition, the stripping agent composition may contain an additive such as a chelating agent within the range so as not to lower the properties such as the stripping property of the resist and prevention of corrosion of semiconductor device materials.

The stripping agent composition of the present invention has a pH of preferably from 8 to 14, more preferably from 10 to 14, from the viewpoint of stripping property of the resist.

The stripping agent composition of the present invention having the above constitutions can be suitably used in the manufacture of a semiconductor device. The semiconductor device includes, but not particularly limited to, a semiconductor device made of Si, GaAs, GaN, InP or the like. Among them, the stripping agent composition of the present invention has an excellent advantage that stripping property of the resist and prevention of corrosion of the semiconductor can be satisfied even in the manufacture of a semiconductor device containing a compound semiconductor device which tends to be particularly easily corroded, such as a semiconductor device made of GaAs. The metal line used in the semiconductor device in the preferred embodiment of the present invention refers to a metal line formed by plating, CVD, PVD or the like. The metal line includes those made of gold, aluminum, copper, tungsten, titanium, tantalum, chromium and the like. Among them, gold and aluminum wires are preferable. The metal line used may be those made of an alloy containing different kinds of metals, or those made of pure metal. Also, the shape of the wire is not particularly limited.

The method for stripping a resist of the present invention includes the step of stripping the resist with the above-mentioned stripping agent composition for a resist in the manufacture of a semiconductor device, and the method can be used in a stripping apparatus of a batch processing, a shower processing, a single-wafer processing or the like. Among them, the method is preferable for stripping apparatuses of a batch processing and a shower processing.

The method for manufacturing a semiconductor device includes the steps of (1) a lithography step including the steps of applying a resist to a semiconductor device made of Si, GaAs, GaN, InP or the like, a metal line and an interlayer insulating thin film, patterning the semiconductor device, exposing the semiconductor device and developing the semiconductor device; (2) an etching step of working the shapes of the semiconductor, the metal line and the interlayer insulating thin film, (3) an ion implantation step, and (4) a step of stripping a resist. Among these steps, it is preferable that the stripping agent composition for a resist of the present invention is used in the step (4) of stripping a resist. A resist applied to a semiconductor device made of Si, GaAs, GaN, InP or the like, even more preferably a compound semiconductor device made of GaAs, GaN, InP or the like, a resist remaining after dry etching, or a resist residue remaining after dry etching followed by ashing, can be stripped at a low temperature and in a short period of time, so that a semiconductor device maintaining the FET property is obtained without corroding the semiconductor device. Here, the FET property refers to a property of drain current against drain voltage, and can be evaluated by the method described in the Examples set forth below. Apparatuses, means and the like usable in each of the above steps (1) to (4) are not particularly limited, and any known ones may be used.

In addition, the stripping agent composition of the present invention can be used in a lift-off step in the manufacture of a compound semiconductor device.

As mentioned above, by using the preferred stripping agent composition of the present invention, a high-quality semiconductor device circuit, especially a compound semiconductor device circuit, can be more economically advantageously manufactured.

EXAMPLES

The following examples further describe and demonstrate embodiments of the present invention. The examples are given solely for the purposes of illustration and are not to be construed as limitations of the present invention.

Examples 1 to 6 and Comparative Examples 1 to 7

1. Preparation of Sample to Be Subjected to Stripping
(1) Positive Resist: An insulation film $Si_3N_4$ having a height of 90 nm and a width of 10 μm was formed on a GaAs semiconductor in stripes every 350 μm. Thereafter, a resist was applied on an entire surface of the semiconductor so as to have a thickness of 3 μm on a dry basis, and the semiconductor was post-baked at 130° C. for 5 minutes. Subsequently, the baked semiconductor was treated with $CF_4$ gas, a reactive ion etching gas, to give a sample to be subjected to stripping. As the resist, the following one were used:

Positive resist: "AZ-4620" (trade name, commercially available from Clariant (Japan) K.K.), novolak resin
(2) Negative Resist: A sample to be subjected to stripping was prepared under the same conditions as in the positive resist except that the semiconductor was exposed to i-ray spectrum at a wavelength of 365 nm after the application of the resist. As the resist, the following one was used:

Negative resist: "TLOR-iNO4MG" (trade name, commercially available from TOKYO OHKA KOGYO CO., LTD.), polyhydroxystyrene resin 2. Stripping Method Stripping of the resist and rinsing treatment were carried out in accordance with the stripping method and conditions as shown in the following Table 1. In the course of the stripping and rinsing treatment, stripping property of positive and negative resists, corrosion resistance (etching amount) for GaAs semiconductor, and FET properties were evaluated as follows. The components of the stripping compositions used and the evaluation results are summarized in Table 2.

TABLE 1

| Step | Stripping | → | Rinse 1 | → | Rinse 2 | → | Drying |
|---|---|---|---|---|---|---|---|
| Conditions | Stripping Composition Each Condition Immersion | → → → | Pure Water Room Temp. for 1 minute Fluidization | → → → | Pure Water Room Temp. for 1 minute Fluidization | → → | Nitrogen Gas Blow |

TABLE 2

| Stripping Composition for Resist (% by weight) | | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|---|---|---|---|---|---|
| A | Monoethanolamine | | | | 1 | | | 1 | 30 | 30 | 40 | | | 10 |
| | N-Methylethanolamine | 1 | 1 | 3 | | 2 | 1 | | | | | 1 | 1 | |
| B | Dimethyl Sulfoxide (26.6) | 67 | | | 67 | 72 | | 80 | | 60 | | | | |
| | Sulforane (27.4) | | | | | | | | 10 | | | | | |
| | N-Methyl-2-pyrrolidone (22.9) | 30.5 | | | 21.5 | | | | | | 20 | | | |
| | Dimethyl formamide (24.8) | | | | | 24 | | | | | | | | |
| | Dimethylacetamide (22.7) | | 98 | 10.5 | | | 91 | | | | | 94 | 86 | |

TABLE 2-continued

| Stripping Composition for Resist (% by weight) | | | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|---|---|---|---|---|---|---|
| | Diethylene glycol monomethyl ether | (22.3) | | | | | | | 19 | | | | | | |
| | Diethylene glycol monobutyl ether | (20.5) | | | 85 | | | | | 60 | | | | | |
| | Diethylene glycol | (29.9) | | | | 10 | | | | | | | | | |
| C | D-Sorbitol | (Molecular Weight: 182) | | | | 0.5 | 1 | 3 | | | | | 5 | 3 | |
| | Xylitol | (Molecular Weight: 152) | | 1 | | | | | | | | | | | |
| | D-Glucose | (Molecular Weight: 180) | | | 1.5 | | | | | | | | | | |
| | D-Mannitol | (Molecular Weight: 182) | 1.5 | | | | | | | | | | | | |
| D | Water | | | | | 1 | 5 | 35 | 5 | 10 | | | | | |
| | Pyrocatechol | | | | | | | | | | 10 | | | | |
| | Oleyl alcohol | (16.6) | | | | | | | | | | | | | 90 |
| | Total | | 100 | 100 | 100 | 100 | 100 | 100 | 100 | 100 | 100 | 100 | 100 | 100 | 100 |
| Properties | | | | | | | | | | | | | | | |
| Stripping Property for Positive Resist | | | ◉ | ○ | ○ | ◉ | ◉ | ○ | ○ | ◉ | ◉ | ◉ | ○ | ○ | X |
| Stripping Property for Negative Resist | | | ○ | ○ | ○ | ◉ | ○ | ○ | ○ | ○ | ○ | ○ | ○ | ○ | X |
| Corrosion Resistance Evaluation: Etching Amount of GaAs nm (70° C. for 13 hours) | | | 4.2 | 6.5 | 3.6 | 3.4 | 7.0 | 18 | 43 | 6700 | 20000 | 42000 | 92 | 110 | 2300 |
| FET Properties (70° C. for 2 hours) $\Delta I_{DS}$ mA (2 V) | | | 0 | 0 | 0 | 0 | 0 | 0 | 2 | 20 | 20 | 20 | 13 | 13 | 20 |

Numbers inside the parentheses for the component B and oleyl alcohol are the values for dissolution parameter (MPa$^{1/2}$).

3. Evaluation for Stripping Property of Positive Resist

The stripping conditions were basically immersion-washing of the sample at 30° C. for 1 minute, and those in which the resist could not be stripped in 1 minute was immersion-washed for 5 minutes. After rinsing and drying, the sample was observed by expanding the field 5000 times and 50000 times with a field emission scanning electron microscope. The resist stripping property was evaluated by the presence or absence of resist residue on the insulation film Si$_3$N$_4$ and the compound semiconductor GaAs as follows:

<Evaluation Criteria>
◉: no resist residue after one-minute of immersion-washing at 30° C.;
○: no resist residue after five-minutes of immersion-washing at 30° C.; and
X: resist residue found.

4. Evaluation for Stripping Property of Negative Resist

The stripping conditions for the sample were to conduct immersion and washing at 70° C. for 30 minutes. After rinsing and drying, the resist stripping property was evaluated by observing the sample surface in the same manner as in the positive resist.

<Evaluation Criteria>
◉: no resist residue (resist dissolves);
○: no resist residue (some resist floats in the stripping composition); and
X: resist residue found.

5. Evaluation for Corrosion Resistance: Etching Amount of Compound Semiconductor Device Alone As shown in FIG. 1, an insulation film 2 (Si$_3$N$_4$) having a height of 90 nm and a width of 10 μm was formed on a GaAs semiconductor 1 in stripes every 350 μm. Using the semiconductor obtained, the etching amount for GaAs was obtained in the following procedures (1) to (4). FIG. 1 is an enlarged view near the insulation film.

(1) An initial step height A (thickness of insulation film; 3 in FIG. 1) was determined with an interatomic force microscope (commercially available from Veeco Instruments Inc. under the trade name of "Auto Probe M5").

(2) The semiconductor was immersed in a stripping composition for 70° C. for 13 hours.

(3) A step height B (a total of a thickness of insulation film and a thickness of the etched portion of the GaAs semiconductor 1; 4 in FIG. 1) was determined.

(4) Etching amount was calculated by the following equation.

Etching Amount=(Step Height $B$)−(Step Height $A$)

In order to increase the measurement accuracy of the step height, the evaluation was made by intentionally extending the immersion time as long as 13 hours. A practical acceptable range of the etching amount of GaAs is within 20 nm under the above conditions.

6. FET Properties

Figure 2:
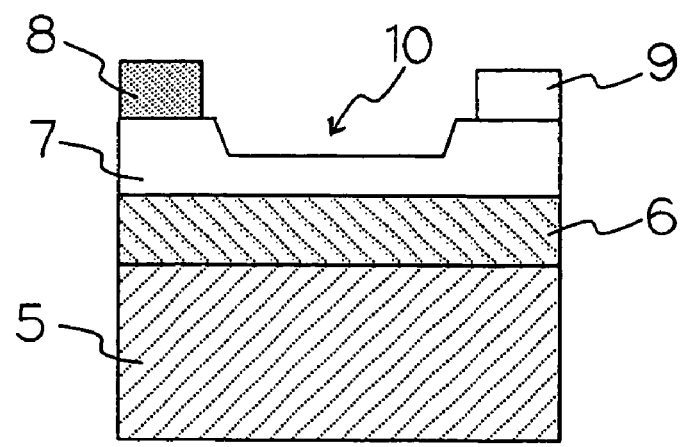
FIG. 2 is a schematic explanatory view of each portion of a substrate used in the evaluation of FET property in the Examples.

GaAsFET: As shown in FIG. 2, a high-resistive buffer layer 6 having a thickness of 3 μm and a n-GaAs active layer 7 having a thickness of 0.2 μm were subjected to cause crystal growth on a semi-insulating GaAs substrate 5. Thereafter, ohmic electrodes (AuGe/Ni) of a source 8 and a drain 9, and a recess 10 were formed. At this time, a voltage of 2V was applied between the ohmic electrodes. Then having no change in electric current values ($I_{DS}$) before and after the immersion in the stripping agent are desirable properties as a stripping composition. The immersion conditions were 70° C. for 2 hours, the time period of which was somewhat longer than the actual stripping conditions. If there is a change in electric current value before and after the immersion in the stripping agent, it is deduced that the electric current becomes small because the width of an active layer in which electric current is communicating becomes narrower due to etching of n-GaAs. The amount of change in electric current values ($\Delta I_{DS}$) before and after the immersion in the stripping agent is obtained by the following equation.

$$\Delta I_{DS}(mA) = I_{DS} \text{ Before Immersion} - I_{DS} \text{ After Immersion}$$
$$= 20 - I_{DS} \text{ After Immersion}$$

Therefore, it is desired that $\Delta I_{DS}$ is 0 mA. When the $\Delta I_{DS}$ is a greater amount of change in electric current than 0 mA, the composition does not serve well as a stripping composition for practical purposes.

It can be seen from the results shown in Table 2 that those satisfying all of the properties of resist stripping property, corrosion resistance and FET properties are Examples 1 to 6, and that any one of these properties are unsatisfactory for Comparative Examples 1 to 7.

By using the stripping composition of the present invention, a high-quality IC or LSI semiconductor device circuit, especially a compound semiconductor device circuit can be more economically advantageously manufactured.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A stripping agent composition for a resist, consisting essentially of by weight of the composition:
    (A) from 0.2 to 3% by weight of an alkanolamine;
    (B) from 95 to 99% by weight of one or more organic solvents having a Hansen's solubility parameter of from 18 to 33 $MPa^{1/2}$ selected from the group consisting of ethers, alcohols, nitrogen-containing compounds, and sulfur-containing compounds;
    (C) from 0.01 to 3% by weight of a sugar; and
    (D) from 0 to 1% by weight of water.

2. The stripping agent composition according to claim 1, wherein the sugar has a molecular weight of from 70 to 350.

3. A method for stripping a resist, comprising the step of stripping the resist with the stripping agent composition of claim 1.

4. A method for stripping a resist, comprising the step of stripping the resist with the stripping agent composition of claim 2.

5. A method for manufacturing a semiconductor device, comprising the step of stripping a resist with the stripping agent composition of claim 1.

6. The method according to claim 5, wherein the semiconductor device is a compound semiconductor device.

7. The method according to claim 6, wherein the compound semiconductor device is a GaAs semiconductor device.

8. A method for manufacturing a semiconductor device, comprising the step of stripping a resist with the stripping agent composition of claim 2.

9. The method according to claim 8, wherein the semiconductor device is a compound semiconductor device.

10. The method according to claim 9, wherein the compound semiconductor device is a GaAs semiconductor device.

* * * * *

UNITED STATES PATENT AND TRADEMARK OFFICE
CERTIFICATE OF CORRECTION

PATENT NO. : 7,879,784 B2
APPLICATION NO. : 10/910338
DATED : February 1, 2011
INVENTOR(S) : Mami Shirota It is certified that error appears in the above-identified patent and that said Letters Patent is hereby corrected as shown below:

At Columns 7-10, replace Table 2 with the following:

Table 2

| Stripping Composition for Resist (% by weight) | | | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|---|---|---|---|---|---|---|---|
| A | Monoethanolamine | | | | | 1 | | | 1 | 30 | 30 | 40 | | | 10 |
| | N-Methylethanolamine | | 1 | 1 | 3 | | 2 | 1 | | | | | 1 | 1 | |
| B | Dimethyl Sulfoxide | (26.6) | 67 | | | 67 | 72 | | 80 | | 60 | | | | |
| | Sulforane | (27.4) | | | | | | | | 10 | | | | | |
| | N-Methyl-2-pyrrolidone | (22.9) | 30.5 | | | 21.5 | | | | | | 20 | | | |
| | Dimethyl formamide | (24.8) | | | | | 24 | | | | | | | | |
| | Dimethylacetamide | (22.7) | | 98 | 10.5 | | | 91 | | | | | 94 | 86 | |
| | Diethylene glycol monomethyl ether | (22.3) | | | | | | | 19 | | | | | | |
| | Diethylene glycol monobutyl ether | (20.5) | | | 85 | | | | | | 60 | | | | |
| | Diethylene glycol | (29.9) | | | | 10 | | | | | | | | | |
| C | D-Sorbitol (Molecular Weight: 182) | | | | | 0.5 | 1 | 3 | | | | 5 | | 3 | |
| | Xylitol (Molecular Weight: 152) | | | 1 | | | | | | | | | | | |
| | D-Glucose (Molecular Weight: 180) | | | | 1.5 | | | | | | | | | | |
| | D-Mannitol (Molecular Weight: 182) | | 1.5 | | | | | | | | | | | | |
| D | Water | | | | | | 1 | 5 | | | | 35 | 5 | 10 | |
| | Pyrocatechol | | | | | | | | | | 10 | | | | |
| | Oleyl alcohol | (16.6) | | | | | | | | | | | | | 90 |
| | Total | | 100 | 100 | 100 | 100 | 100 | 100 | 100 | 100 | 100 | 100 | 100 | 100 | 100 |
| Properties | | | | | | | | | | | | | | | |
| | Stripping Property for Positive Resist | | ◉ | ○ | ○ | ◉ | ◉ | ○ | ○ | ◉ | ◉ | ◉ | ○ | ○ | × |
| | Stripping Property for Negative Resist | | ○ | ○ | ○ | ◉ | ○ | ○ | ○ | ○ | ○ | ○ | ○ | ○ | × |
| | Corrosion Resistance Evaluation: Etching Amount of GaAs nm (70°C for 13 hours) | | 4.2 | 6.5 | 3.6 | 3.4 | 7.0 | 18 | 43 | 6700 | 20000 | 42000 | 92 | 110 | 2300 |
| | FET Properties (70°C for 2 hours) $\Delta I_{DS}$ mA (2V) | | 0 | 0 | 0 | 0 | 0 | 0 | 2 | 20 | 20 | 20 | 13 | 13 | 20 |

Numbers inside the parentheses for the component B and oleyl alcohol are the values for dissolution parameter $(MPa^{1/2})$.

Signed and Sealed this
Nineteenth Day of April, 2011

David J. Kappos
*Director of the United States Patent and Trademark Office*